US012792898B2

(12) United States Patent
Pershyn

(10) Patent No.: US 12,792,898 B2
(45) Date of Patent: Nov. 10, 2026

(54) SEMI-STOCHASTIC BOOLEAN-NEURAL HYBRIDS FOR SOLVING HARD PROBLEMS

(71) Applicant: University of South Carolina, Columbia, SC (US)

(72) Inventor: Yuriy Pershyn, Irmo, SC (US)

(73) Assignee: University of South Carolina, Columbia, SC (US)

( * ) Notice: Subject to any disclaimer, the term of this patent is extended or adjusted under 35 U.S.C. 154(b) by 1391 days.

(21) Appl. No.: 17/241,508

(22) Filed: Apr. 27, 2021

(65) Prior Publication Data

US 2021/0342681 A1 Nov. 4, 2021

Related U.S. Application Data

(60) Provisional application No. 63/017,053, filed on Apr. 29, 2020.

(51) Int. Cl.

| | |
|---|---|
| ***G06N 3/065*** | (2023.01) |
| ***G06F 30/367*** | (2020.01) |
| ***G06N 3/044*** | (2023.01) |
| ***G06N 3/047*** | (2023.01) |
| ***G06N 7/08*** | (2006.01) |
| ***H03K 19/21*** | (2006.01) |

(52) U.S. Cl.

CPC ........... *G06N 3/065* (2023.01); *G06F 30/367* (2020.01); *G06N 3/044* (2023.01); *G06N 3/047* (2023.01); *G06N 7/08* (2013.01); *H03K 19/21* (2013.01)

(58) Field of Classification Search

CPC ........ G06N 3/065; G06N 3/044; G06N 3/047; G06N 7/08; G06F 30/367; H03K 19/21

See application file for complete search history.

(56) References Cited

U.S. PATENT DOCUMENTS

| | | | | |
|---|---|---|---|---|
| 2009/0228238 A1* | 9/2009 | Mansinghka | ............ G06N 7/01 702/181 |
| 2015/0039546 A1* | 2/2015 | Alvarez-Icaza | ........ G06N 3/049 706/27 |

(Continued)

OTHER PUBLICATIONS

"Efficient CMOS Invertible Logic Using Stochastic Computing," in IEEE Transactions on Circuits and Systems I: Regular Papers, vol. 66, No. 6, pp. 2263-2274, Jun. 2019, doi: 10.1109/TCSI.2018.2889732. (Year: 2019).*

(Continued)

*Primary Examiner* — Jennifer N Welch
*Assistant Examiner* — Amy P Hoang
(74) *Attorney, Agent, or Firm* — Douglas L. Lineberry; Maynard Nexsen PC

(57) ABSTRACT

Described herein are methods of and systems for finding solutions to hard problems including factorization, subset sum, maximum satisfiability, bitcoin mining, and many other related and unrelated problems based on a novel type of computing circuits—Boolean-neural hybrids—that combine traditional two- or three-state logic gates with semi-stochastic neurons. Semi-stochastic neurons are a new type of artificial neurons that search for a problem solution stochastically and store the solution deterministically when it is found. Boolean-neural hybrids are based on invertible logic gates and operate in reverse: the input data are applied to the output, and the result is read from the input.

19 Claims, 15 Drawing Sheets

(56) References Cited

U.S. PATENT DOCUMENTS

| | | | | |
|---|---|---|---|---|
| 2017/0365313 | A1* | 12/2017 | Augustine | G11C 11/1659 |
| 2018/0144239 | A1* | 5/2018 | Di Ventra | G06N 3/063 |

OTHER PUBLICATIONS

"Probabilistic Computing with Binary Stochastic Neurons," 2019 IEEE Bicmos and Compound semiconductor Integrated Circuits and Technology Symposium (BCICTS), Nashville, TN, USA, 2019, pp. 1-6, doi: 10.1109/BCICTS45179.2019.8972719. (Year: 2019).*

"Computational properties of cerebellar nucleus neurons: Effects of stochastic ion channel gating and input location", https://uhra.herts.ac.uk/id/eprint/16984 (Year: 2018).*

* cited by examiner (a)

(b)

TABLE 1

(a)

| a | b | c |
|---|---|---|
| 0 | 0 | 0 |
| 1 | 0 | 1 |
| 0 | 1 | 1 |
| 1 | 1 | 0 |

(b)

| b | c | a |
|---|---|---|
| 0 | 0 | 0 |
| 1 | 0 | 1 |
| 0 | 1 | 1 |
| 1 | 1 | 0 |

(c)

| a | c | b |
|---|---|---|
| 0 | 0 | 0 |
| 1 | 0 | 1 |
| 0 | 1 | 1 |
| 1 | 1 | 0 |

FIGURE 5

TABLE 2

(a)

| a | b | c |
|---|---|---|
| 0 | 0 | 0 |
| 1 | 0 | 1 |
| 0 | 1 | 1 |
| 1 | 1 | 1 |

(b)

| b | c | a |
|---|---|---|
| 0 | 0 | 0 |
| 1 | 0 | 0 |
| 0 | 1 | 1 |
| 1 | 1 | 0 or 1 |

(c)

| a | c | b |
|---|---|---|
| 0 | 0 | 0 |
| 1 | 0 | 0 |
| 0 | 1 | 1 |
| 1 | 1 | 0 or 1 |

FIGURE 6

TABLE 3

(a)

| a | b | c |
|---|---|---|
| 0 | 0 | 0 |
| 1 | 0 | 0 |
| 0 | 1 | 0 |
| 1 | 1 | 1 |

(b)

| b | c | a |
|---|---|---|
| 0 | 0 | 0 or 1 |
| 1 | 0 | 0 |
| 0 | 1 | 1 |
| 1 | 1 | 1 |

(c)

| a | c | b |
|---|---|---|
| 0 | 0 | 0 or 1 |
| 1 | 0 | 0 |
| 0 | 1 | 1 |
| 1 | 1 | 1 |

FIGURE 7

TABLE 4

(a)

| a | b | c |
|---|---|---|
| 0 | 0 | 1 |
| 1 | 0 | 1 |
| 0 | 1 | 1 |
| 1 | 1 | 0 |

(b)

| b | c | a |
|---|---|---|
| 0 | 0 | 1 |
| 1 | 0 | 1 |
| 0 | 1 | 0 or 1 |
| 1 | 1 | 0 |

(c)

| a | c | b |
|---|---|---|
| 0 | 0 | 1 |
| 1 | 0 | 1 |
| 0 | 1 | 0 or 1 |
| 1 | 1 | 0 |

FIGURE 8

TABLE 5

(a)

| a | b | c |
|---|---|---|
| 0 | 0 | 1 |
| 1 | 0 | 0 |
| 0 | 1 | 0 |
| 1 | 1 | 0 |

(b)

| b | c | a |
|---|---|---|
| 0 | 0 | 1 |
| 1 | 0 | 0 or 1 |
| 0 | 1 | 0 |
| 1 | 1 | 0 |

(c)

| a | c | b |
|---|---|---|
| 0 | 0 | 1 |
| 1 | 0 | 0 or 1 |
| 0 | 1 | 0 |
| 1 | 1 | 0 |

FIGURE 9

TABLE 6

(a)

| a | b | c |
|---|---|---|
| 0 | 0 | 1 |
| 1 | 0 | 0 |
| 0 | 1 | 1 |
| 1 | 1 | 1 |

(b)

| b | c | a |
|---|---|---|
| 0 | 0 | 1 |
| 1 | 0 | 1 |
| 0 | 1 | 0 |
| 1 | 1 | 0 or 1 |

(c)

| a | c | b |
|---|---|---|
| 0 | 0 | 0 |
| 1 | 0 | 0 |
| 0 | 1 | 0 or 1 |
| 1 | 1 | 1 |

FIGURE 10

SEMI-STOCHASTIC BOOLEAN-NEURAL HYBRIDS FOR SOLVING HARD PROBLEMS

TECHNICAL FIELD

The subject matter disclosed herein is generally directed to apparatus and methods for finding solutions to hard problems including factorization, subset sum, maximum satisfiability, bitcoin mining, and many other related and unrelated problems based on a novel type of computing circuits—Boolean-neural hybrids—that combine traditional two- or three-state logic gates with semi-stochastic neurons.

BACKGROUND

Currently, complex problems are solved with conventional computers, GPU-accelerated computers, computer clusters and supercomputers. Related emerging technologies are quantum computing, probabilistic spin logic, and memcomputing.

Quantum computation offers algorithms that in principle allow finding solution of some particular problems on quantum computers exponentially faster compared to the conventional computing algorithms. A well-known example is the Shor's factorization algorithm. Up to now, however, the Shor's algorithm has been demonstrated experimentally only on a small number of qubits.

Probabilistic spin logic utilizes stochastic magnetic tunnel junctions (also known as p-bits). Each p-bit has the functionality of the binary stochastic neuron. It was shown that the solution of a factorization problem can be extracted from histograms of the time fluctuations in an electronic circuit. Moreover, the factorization can be casted as an inverse multiplication problem. An algorithm was presented to design a Boltzmann machine to represent basic Boolean elements (full adders, AND, etc.). It was shown that the Boltzmann machines are invertible: not only do they provide the correct output for a given input, for a given output they provide the correct input(s). A practical implementation of invertible logic, however, requires a large number of p-bits and long sampling times to read the result (since p-bits fluctuate continuously).

In memcomputing, the input and output terminals of logic gates and their circuits are treated on an equal footing, as in the probabilistic spin logic. However, the building blocks and operating principles of memcomputing are very different. Importantly, memcomputing is a fully deterministic approach based on dynamics of memristors. In memcomputing, the problem solution is found with the help of self-organizing logic gates, which for a given output self-organize to provide the solution input. The internal structure of such gates is quite complex: a single self-organizing gate involves multiple memristors (resistors with memory) and voltage-controlled sources.

Accordingly, it is an object of the present disclosure to provide apparatus and methods of finding solutions to hard problems including factorization, subset sum, maximum satisfiability, bitcoin mining, and many other related and unrelated problems efficiently and fast. Accordingly, it is an object of the present disclosure to introduce a specialized electronic circuit that could solve the aforementioned problems efficiently and fast. This may be implemented in software or hardware. Thus, the current disclosure provides methods of and systems for finding solutions to hard problems including factorization, subset sum, maximum satisfiability, bitcoin mining, and many other related and unrelated problems based on a novel type of computing circuits—Boolean-neural hybrids—that combine traditional two- or three-state logic gates with semi-stochastic neurons. Semi-stochastic neurons are a new type of artificial neurons that search for a problem solution stochastically and store the solution deterministically when it is found. Boolean-neural hybrids are based on invertible logic gates and operate in reverse: the input data are applied to the output, and the result is read from the input.

Citation or identification of any document in this application is not an admission that such a document is available as prior art to the present disclosure.

SUMMARY

The above objectives are accomplished according to the present disclosure by providing in a first embodiment, at least one Boolean-neural hybrid computing circuit. The circuit includes at least one invertible logic gate, and at least one semi-stochastic neuron with an input domain divided into regions of stochastic and deterministic behavior. The invertible logic gates involve feedback circuitry that transfers information in a reverse direction. The Boolean-neural hybrid computing circuit operates in reverse wherein input data is applied to at least one output pin and a result is read from the input. Yet again, the Boolean-neural hybrid computing circuit may support both direct and inverse calculations. Moreover, the Boolean-neural hybrid circuits can be designed employing two- or three-state logic and/or emerging electronic devices. Still further, semi-stochastic neurons search solutions stochastically and store them deterministically. Still further, the at least one semi-stochastic neuron may search stochastically and store at least one solution deterministically. Yet further, the semi-stochastic neuron may be described by equation:

$$BSSN(V) = H\left[\frac{V-\delta}{V_1-2\delta} - r\right].$$

Still yet further, the semi-stochastic neuron input combined input V may be calculated by equation:

$$V = \begin{cases} aV_I + b\sum_j V_{F,j} & \text{(in the presence of at least one input)} \\ V_1/2 & \text{(otherwise)} \end{cases}$$

In a further embodiment, a method of forming at least one Boolean-neural hybrid computing circuits may be provided that can operate in reverse wherein input data is applied to at least one output pin and reads a result from the input is provided. The method may include forming at least one invertible logic gate, forming at least one semi-stochastic neuron with an input domain divided into regions of stochastic and deterministic behavior, forming feedback circuitry, forming at Boolean-neural hybrid computing circuit that may employ at least one invertible logic gate and may operate in reverse wherein input data is applied to at least output pin and reads a result from the input data. Further, the method may include. Still yet, the feedback circuitry may be formed to transfer information in a reverse direction. Yet again, the Boolean-neural hybrid computing circuit may be formed to support both direct and inverse calculations. Moreover, the method may include the design of the Boolean-neural hybrid circuits employing two- or three-state logic and/or emerging memory devices. forming the at least one logic gate as a two or three state logic gate. Still, the at least one logic gate may be configured to be followed by only one semi-stochastic neuron. Further again, the at least one semi-stochastic neurons search for the problem solution stochastically and store the solution deterministically. Further again, the at least one semi-stochastic neuron may search stochastically and may store at least one solution deterministically. Further yet, the semi-stochastic neuron may be described by equation:

$$BSSN(V) = H\left[\frac{V-\delta}{V_1 - 2\delta} - r\right].$$

Again, the method may include calculating semi-stochastic neuron combined input V by equation:

$$V = \begin{cases} aV_I + b\sum_j V_{F,j} & \text{(in the presence of at least one input)} \\ V_1/2 & \text{(otherwise)} \end{cases}.$$

These and other aspects, objects, features, and advantages of the example embodiments will become apparent to those having ordinary skill in the art upon consideration of the following detailed description of example embodiments.

BRIEF DESCRIPTION OF THE DRAWINGS

The construction designed to carry out the disclosure will hereinafter be described, together with other features thereof. The disclosure will be more readily understood from a reading of the following specification and by reference to the accompanying drawings forming a part thereof, wherein an example of the disclosure is shown and wherein:

FIG. 5 shows XOR tables for (a) direct and (b), (c) reverse operation.

FIG. 6 shows OR tables for (a) direct and (b), (c) reverse operation.

FIG. 7 shows AND tables for (a) direct and (b), (c) reverse operation.

FIG. 8 shows NAND tables for (a) direct and (b), (c) reverse operation.

FIG. 9 shows NOR tables for (a) direct and (b), (c) reverse operation.

FIG. 10 shows IMP tables for (a) direct and (b), (c) reverse operation.

Figure 1:
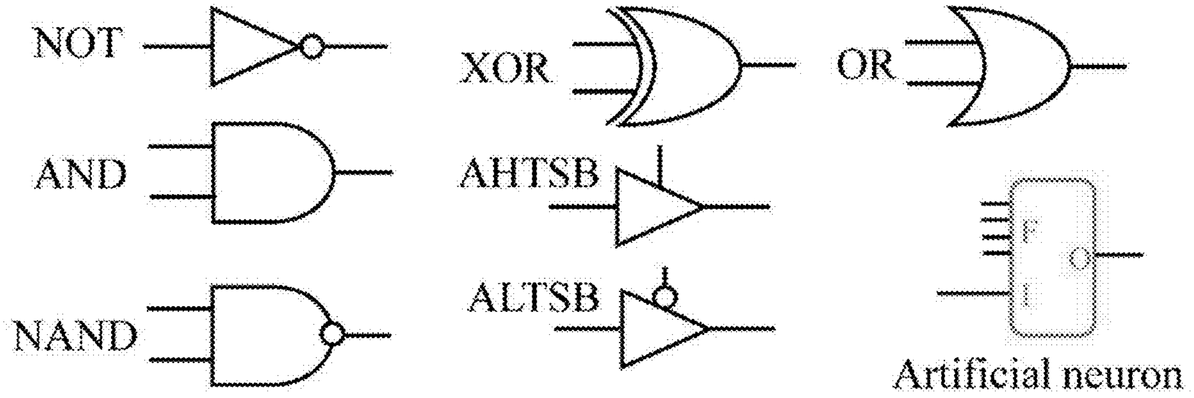
FIG. 1 shows a summary of circuit symbols.

The figures herein are for illustrative purposes only and are not necessarily drawn to scale.

DETAILED DESCRIPTION OF THE EXAMPLE EMBODIMENTS

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are cited to disclose and describe the methods and/or materials in connection with which the publications are cited. All such publications and patents are herein incorporated by references as if each individual publication or patent were specifically and individually indicated to be incorporated by reference. Such incorporation by reference is expressly limited to the methods and/or materials described in the cited publications and patents and does not extend to any lexicographical definitions from the cited publications and patents. Any lexicographical definition in the publications and patents cited that is not also expressly repeated in the instant application should not be treated as such and should not be read as defining any terms appearing in the accompanying claims. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

As used herein, the singular forms “a”, “an”, and “the” include both singular and plural referents unless the context clearly dictates otherwise.

As used herein, “about,” “approximately,” “substantially,” and the like, when used in connection with a measurable variable such as a parameter, an amount, a temporal duration, and the like, are meant to encompass variations of and from the specified value including those within experimental error (which can be determined by e.g. given data set, art accepted standard, and/or with e.g. a given confidence interval (e.g. 90%, 95%, or more confidence interval from the mean), such as variations of +/−10% or less, +/−5% or less, +/−1% or less, and +/−0.1% or less of and from the specified value, insofar such variations are appropriate to perform in the disclosure. As used herein, the terms “about,” “approximate,” “at or about,” and “substantially” can mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In general, an amount, size, formulation, parameter or other quantity or characteristic is “about,” “approximate,” or “at or about” whether or not expressly stated to be such. It is understood that where “about,” “approximate,” or “at or about” is used before a quantitative value, the parameter also includes the specific quantitative value itself, unless specifically stated otherwise.

The term “optional” or “optionally” means that the subsequent described event, circumstance or substituent may or may not occur, and that the description includes instances where the event or circumstance occurs and instances where it does not.

Various embodiments are described hereinafter. It should be noted that the specific embodiments are not intended as an exhaustive description or as a limitation to the broader aspects discussed herein. One aspect described in conjunction with a particular embodiment is not necessarily limited to that embodiment and can be practiced with any other embodiment(s). Reference throughout this specification to “one embodiment”, “an embodiment,” “an example embodiment,” means that a particular feature, structure or characteristic described in connection with the embodiment is included in at least one embodiment of the present disclosure. Thus, appearances of the phrases “in one embodiment,” “in an embodiment,” or “an example embodiment” in various places throughout this specification are not necessarily all referring to the same embodiment, but may. Furthermore, the particular features, structures or characteristics may be combined in any suitable manner, as would be apparent to a person skilled in the art from this disclosure, in one or more embodiments. Furthermore, while some embodiments described herein include some but not other features included in other embodiments, combinations of features of different embodiments are meant to be within the scope of the disclosure. For example, in the appended claims, any of the claimed embodiments can be used in any combination.

All patents, patent applications, published applications, and publications, databases, websites and other published materials cited herein are hereby incorporated by reference to the same extent as though each individual publication, published patent document, or patent application was specifically and individually indicated as being incorporated by reference.

FIG. 1 shows a summary of circuit symbols. Here, NOT, AND, NAND, OR, and XOR are standard Boolean gates, AHTSB (ALTSB) denotes the active high (low) three-state buffer. In AHTSB (ALTSB), the data from the input (left terminal) are transferred to the output only when an active high (low) is applied to the middle terminal. Otherwise, the output is in the high-impedance state. The output (O) of the artificial neuron depends on the direct (I) and feedback (F) inputs.

This disclosure is related to methods of finding solutions to hard problems including factorization, subset sum, maximum satisfiability, bitcoin mining, and many other related and unrelated problems. The method is based on a novel type of computing circuits—Boolean-neural hybrids—that combine traditional two- or three-state logic gates with semi-stochastic neurons. Semi-stochastic neurons are a new type of artificial neurons that search for a problem solution stochastically and store the solution deterministically when it is found. Boolean-neural hybrids are based on invertible logic gates and operate in reverse: the input data are applied to the output (and, in some cases, to other parts of the circuit), and the result is read from the input. This disclosure provides a potentially more efficient way to solve various hard problems. It is expected that the solution presented in this disclosure is more efficient compared to the existing approaches and easier to implement in hardware.

Boolean-Neural Hybrids

Figure 2:
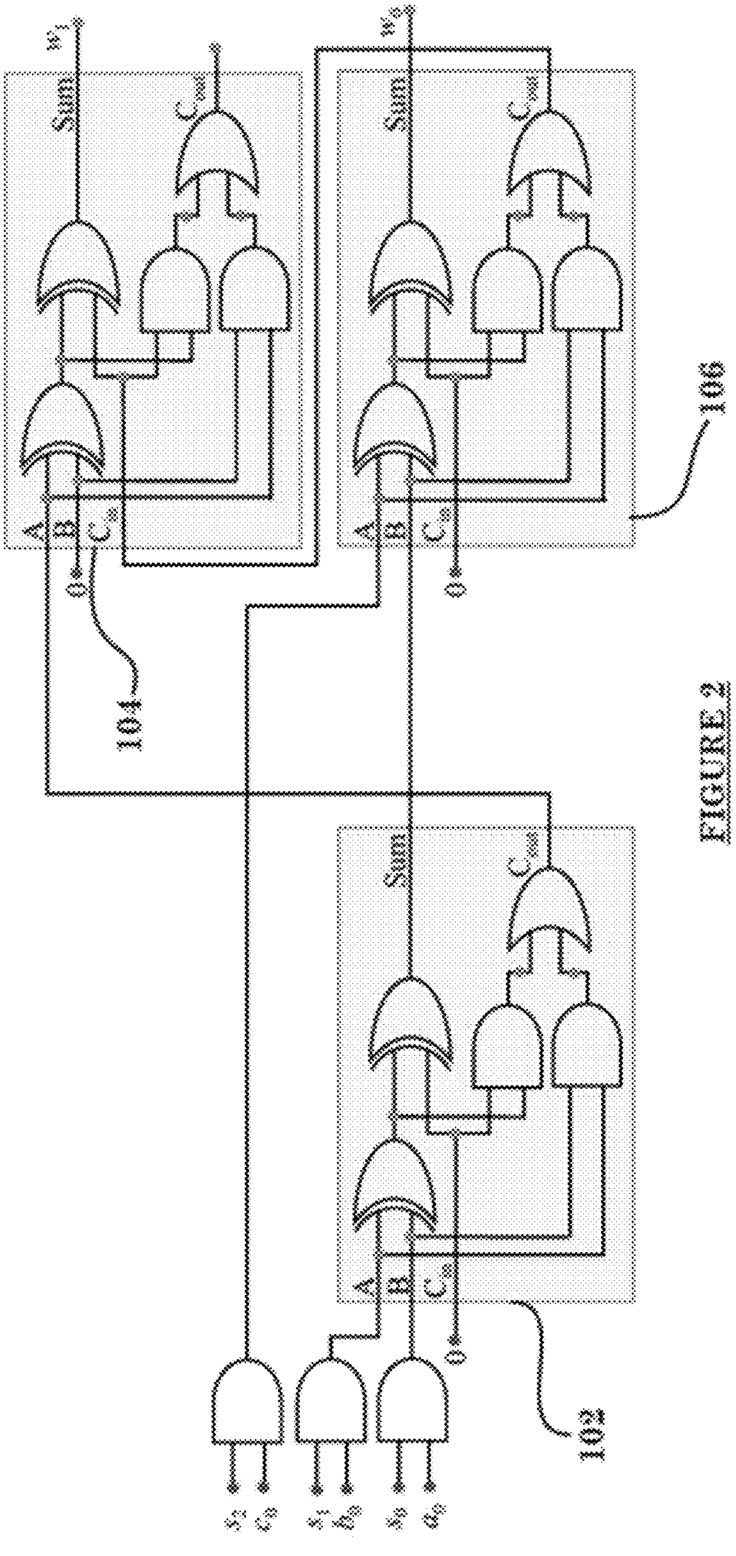
FIG. 2 shows a conventional logic circuit for a subset sum calculation.

This disclosure introduces Boolean-neural hybrids as a generalization of traditional logic gates for operation in reverse. In Boolean-neural hybrids, the original logic gates representing the direct calculation are “loaded” with semi-stochastic neurons and feedback circuitry. Boolean-neural hybrids thus support both the direct and inverse calculations. FIG. 2 shows a conventional logic circuit for a subset sum calculation. The input and control signals (denoted by the red dots) are applied to the nodes located mainly to the left ($s_2$, $c_0$, $s_1$, $b_0$, $s_0$, $a_0$, and 0-s). The result appears to the right as $w_1$, $C_{out}$=0, and $w_0$. The rectangular blocks 102, 104, and 106 are full adders.

Consider the subset sum problem, which is an important decision problem: given a set of integer numbers a, b, . . . does any subset of them sum to precisely W? For illustrative purposes, FIG. 2 presents a conventional logic circuit that implements the direct calculation. Here, three one-bit input numbers $a_0$, $b_0$, and $c_0$ are first multiplied by single-bit flags $s_0$, $s_1$, and $s_2$, and summed afterwards:

$$a_0 \cdot s_0 + b_0 \cdot s_1 + c_0 \cdot s_2 = W, \tag{1}$$

where W is a two-bit number ($w_1$, $w_0$). FIG. 2 circuit finds W based on the knowledge of $a_0$, $b_0$, $c_0$, $s_0$, $s_1$, and $s_2$. However, we are interested in the inverse calculation: given W, $a_0$, $b_0$, $c_0$, find $s_0$, $s_1$, and $s_2$ such that Eq. (1) is satisfied.

Figure 3:
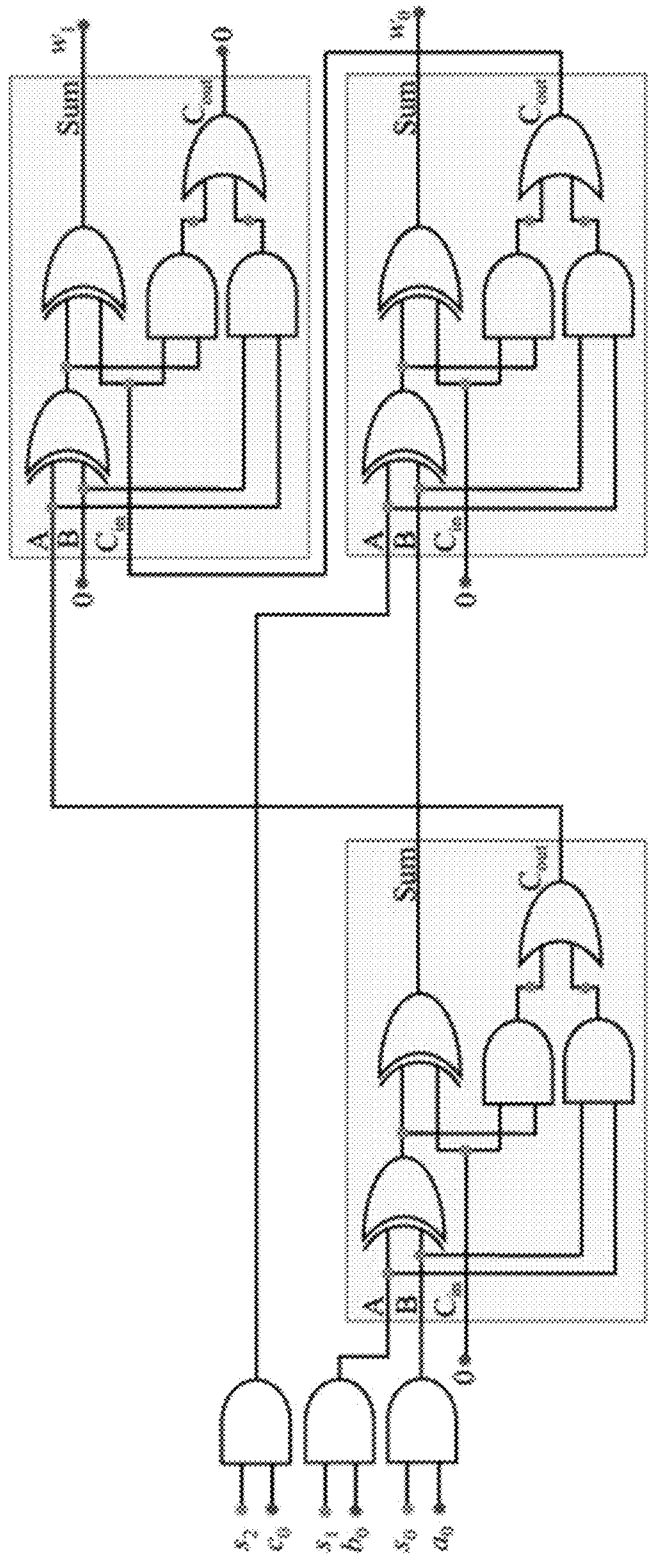
FIG. 3 shows hypothetically a calculation in reverse that is not available with the conventional circuit.

The desired regime of inverse calculation is presented in FIG. 3. In FIG. 3, the input signals are applied to the red dots (such as the ones denoting $w_1$, $w_2$, $a_0$, $b_0$, and $c_0$), and the calculation result appears at $s_0$, $s_1$, and $s_2$. These ends are attained in the present disclosure by: (i) replacing each blue dot in FIG. 3 by a semi-stochastic neuron, and (ii) enhancing each logic gate by a feedback circuitry. The modified circuit is referred to as the Boolean-neural hybrid. It can be considered as a combination of a neural network and Boolean logic. The Boolean-neural hybrids solve problems using the combination of the stochastic and deterministic behavior of semi-stochastic neurons.

FIG. 3 shows hypothetically the calculation in reverse, which is not available in the conventional circuits. Here, the input data and control signals are applied to the right ($w_0$, 0, $w_1$) and other parts of the circuit ($a_0$, $b_0$, $c_0$, 0-s), while the calculation result ($s_0$, $s_1$, $s_2$) appears to the left.

The above example presents the general approach of the current disclosure. It can be used to solve various hard problems including factorization, subset sum, maximum satisfiability, bitcoin mining, and many other related and unrelated problems. The next Section presents the concept of semi-stochastic neurons followed by a Section describing the feedback circuitry (invertible logic gates).

Semi-Stochastic Neurons

Semi-stochastic neurons are part of this disclosure. They are a type of artificial neurons (cells) exhibiting either stochastic or deterministic behavior depending on their inputs. FIG. 1 presents the circuit symbol of semi-stochastic neuron. The inputs are I (direct) and F (feedback). The output is O. The number of feedback inputs is NF. Other input configurations are possible. When a neuron follows a logic gate (each logic gate can be followed only by one neuron), its direct input I is directly connected to the output of the logic gate it follows. Otherwise, the I is not used (disregarded).

Semi-stochastic neurons can be realized using emerging electronics devices, digital or analog electronics, or their combination. The applications of semi-stochastic neurons are not limited to the circuits described in this document. A distinguishable feature of semi-stochastic neurons is that their input domain is divided into regions of stochastic and deterministic behavior of the neuron.

Deterministic behavior—We say that the neuron is at equilibrium if all its inputs and output are in agreement (the same). At equilibrium, the neuron output remains constant in time (deterministic).

Stochastic behavior—In the out-of-equilibrium situations, the neuron output changes stochastically. In this way, the neurons explore their phase space until the solution (corresponding to the circuit equilibrium) is found.

Figure 4:
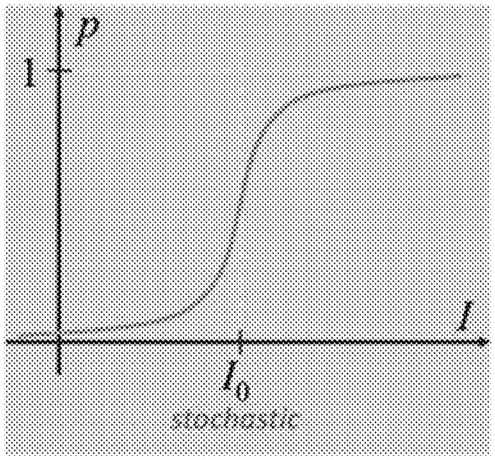
FIG. 4 shows the probability of finding a neuron in state 1 as a function of input for (a) Eq. (2) neuron model, and (b) Eq. (3) neuron model.
Figure 4:
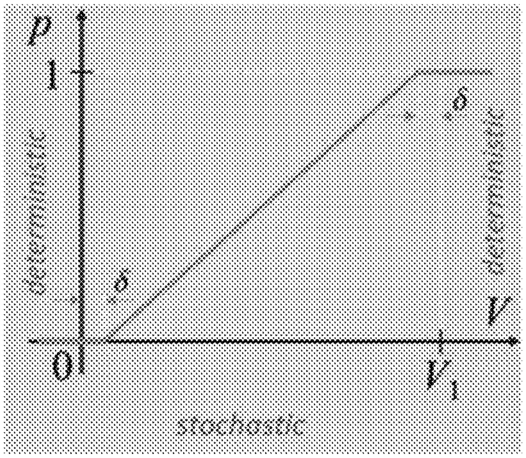

Stochastic neurons are not uncommon in the literature. One example is the binary stochastic neuron, which is closely related to the concept of p-bits. The output of the binary stochastic neuron, BSN(I), at a given time step, is defined by:

$$BSN^I(I) = H\left[\frac{1}{1+\exp(-(I-I_0))} - r\right], \quad (2)$$

where I is the input, His the Heaviside step function, $I_0$ is a horizontal shift, and r is a random number between 0 and 1. FIG. 4 at (a) presents the probability of state 1 for Eq. (2) model. The binary stochastic neurons, however, are not suitable for our purposes as BSN(I) is stochastic in the entire range of I.

There are many ways to realize semi-stochastic neurons. As an example, consider a semi-stochastic binary neuron described by:

$$BSSN(V) = H\left[\frac{V-\delta}{V_1-2\delta} - r\right] \quad (3)$$

that is illustrated in FIG. 4 at (b). Here, Vis the combined input (an internal signal of the neuron), $V_1$ is the voltage corresponding to the logic level one, δ is used to define the boundaries between the stochastic and deterministic response (see FIG. 4 at (b)), and r is a random number between 0 and 1. It follows from Eq. (3) that the output is stochastic for $\delta<V<V_1-\delta$ and deterministic otherwise.

The combined input V can be calculated as a weighted sum of voltages applied to the direct ($V_1$) and feedback ($V_F$,j) inputs:

$$V = \begin{cases} aV_I + b\sum_j V_{F,j} & \text{(in the presence of at least one input)} \\ V_1/2 & \text{(otherwise)} \end{cases}, \quad (4)$$

where a and b are the weights of the direct and feedback inputs ($a+b\tilde{N}_F=1$), respectively, and $\tilde{N}_F$ is the number of deterministic feedback signals (as we discuss below, there are 3 states of feedback: 0, 1 (deterministic), and "0 or 1" (nondeterministic or "any")). The sum is taken over the deterministic feedbacks. Care must be taken to ensure that V falls into the stochastic region in all possible non-equilibrium situations. Neurons with non-connected I are described by a=0. Other definitions of V are possible.

The average attempt switching rate of out-of-equilibrium neurons can be defined by a constant γ. In software realization, at each time step for each neuron a random number may be drawn from a uniform distribution and compared to γ. When the random number is smaller than γ, the neuron changes its state (output) based on Eqs. (3) and (4).

The above example of semi-stochastic neuron is presented for illustrative purposes only. Semi-stochastic neurons are not limited to the above model, and their behavior may include other features such as a refractory period, etc.

Feedback Circuitry

The feedback circuitry is used to transfer the information in the reverse direction. This makes Boolean neural hybrids similar to the recurrent neural networks. Importantly, each feedback signal indicates the state of the gate input that would allow reaching the logical consistency with another input and output in the same gate. FIGS. 5-10 show the direct and reverse logic tables for XOR, OR, AND, NAND, NOR, and IMP gates, respectively. Except of XOR, in the reverse direction, there are 3 levels/types of feedback: 0, 1, and "0 or 1".

The feedback information can be transferred using a single wire in the regime of three-state logic ("0 or 1" is assigned to the high impedance (Hi-Z) state) or two wires in the regime of two-state (binary) logic. The high impedance state refers to an output signal state in which the signal is not being driven. The signal is left open, so that another output pin (e.g. elsewhere on a bus) can drive the signal or the signal level can be determined by a passive device (typically, a pull-up resistor). Other realizations of the feedback signal are possible.

Figure 11:
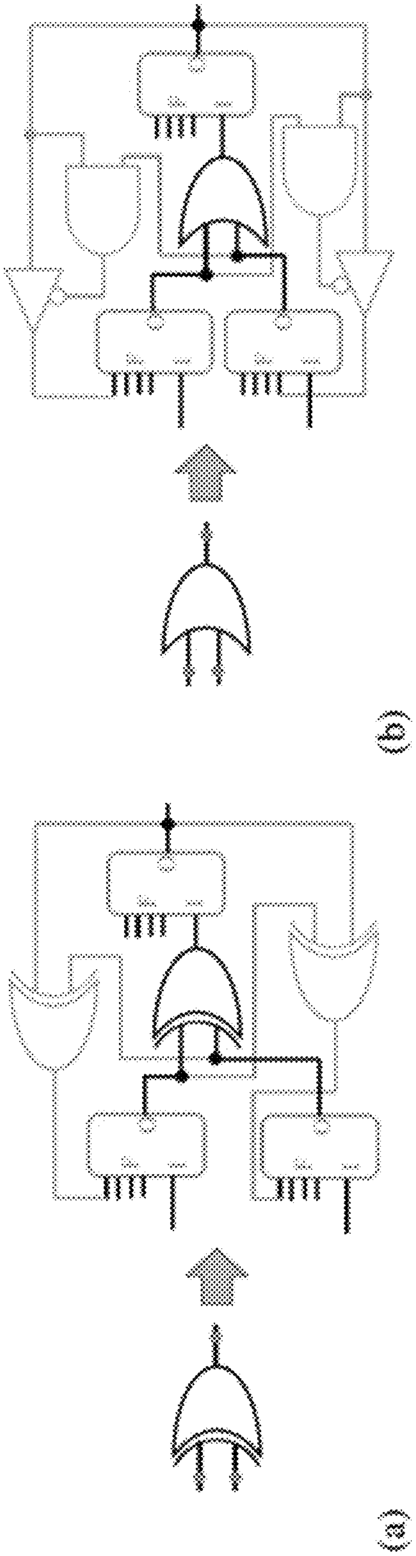
FIG. 11 shows traditional and invertible (a) XOR and (b) OR using three-state logic.

FIG. 11 shows possible three-state logic implementations of XOR and OR designed following FIGS. 5 and 6. According to FIG. 5, the reversible XOR is fully deterministic. Because of this, its feedback circuitry utilizes only two-state logic gates. The circuit in FIG. 11 at (b) is designed such that the "input" combinations b=1, c=1 (see FIG. 6 at (b)) and a=1, c=1 (FIG. 6 at (c)) correspond to Hi-Z states of the feedback (fed to F inputs of neurons).

Figure 12:
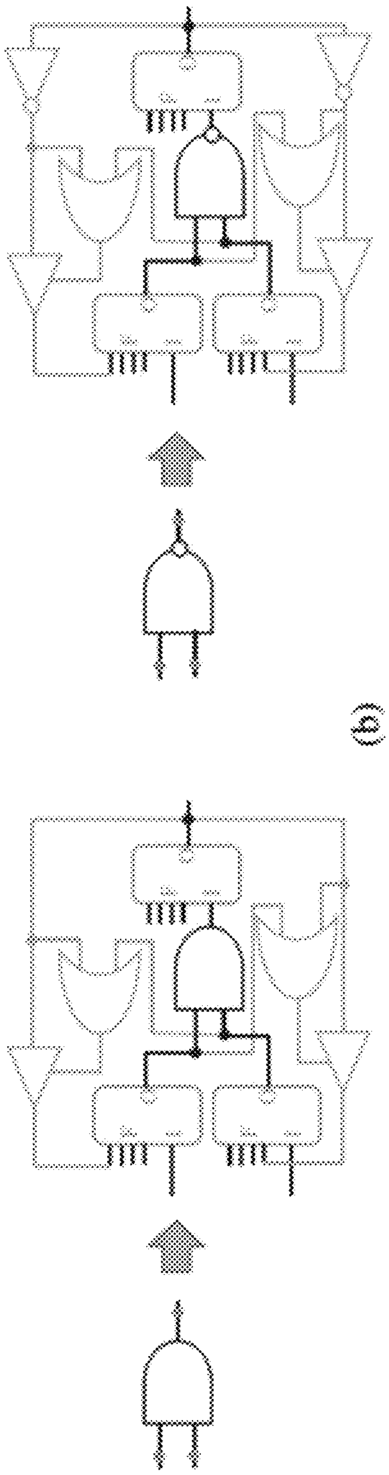
FIG. 12 shows a possible realization of invertible (a) AND and (b) NAND using three-state logic.

The same approach can be used to design other reversible gates. FIG. 12 presents possible three-state logic implementations of AND and NAND designed following FIGS. 7 and 8.

Figure 13:
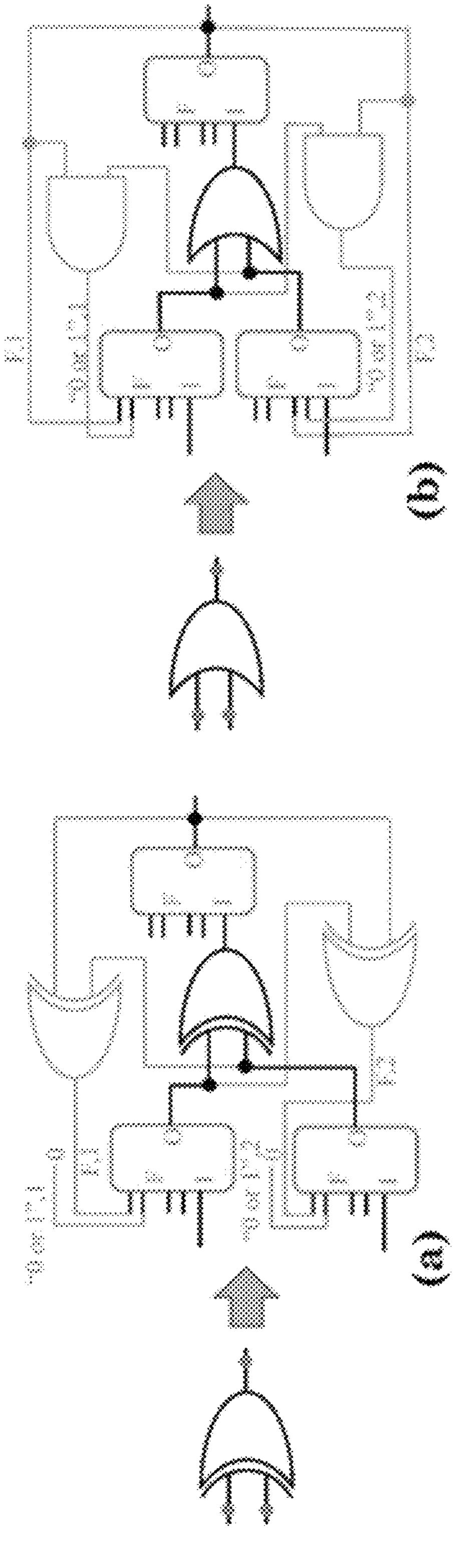
FIG. 13 shows traditional and invertible (a) XOR and (b) OR using two-state logic.

Two wires such as "F,1" and "0 or 1" in FIG. 13 can be used to transfer the feedback signal employing two-state logic. When "0 or 1" is in 1, the signal at "F,1" is disregarded by the neuron. Otherwise, the feedback value is provided by "F,1". FIG. 13 shows examples of implementations of XOR and OR gates designed following FIGS. 5 and 6 based on two-state logic. The design approach to other invertible gates can be understood from FIG. 13.

Realizations

Software Implementation

The Boolean-neural hybrid circuits may be simulated using a custom code (nonparallel or parallel), or any other suitable software tool. A possible simulation protocol proceeds as follows. The calculation starts from a random or deterministic state with input data applied to the "output". At each step and for each neuron, the direct and feedback input levels are identified based on the network topology and states of relevant neurons. The neurons are updated according to their behavioral model. The code exits upon reaching either the global equilibrium or maximum number of steps. The code saves the final state as well as the "best solution" that can be used in the cases wherein the exact solution cannot be found (e.g., in the case of MAX-SAT problem).

Figure 14:
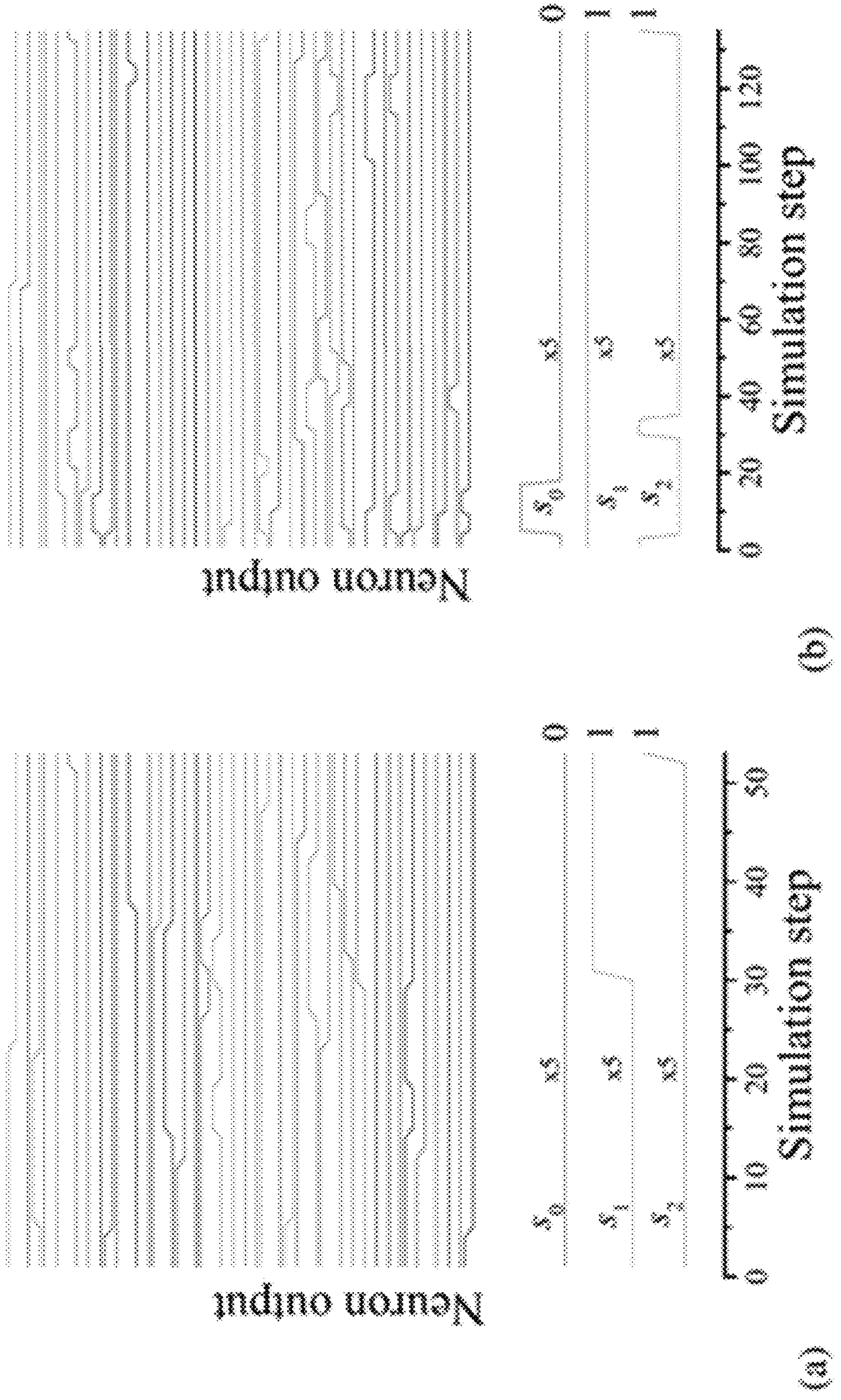
FIG. 14 shows a solution of a subset sum problem with Boolean-neural hybrids: two realizations of circuit dynamics with random initial states of neurons.

A proof of the concept simulation is presented in FIG. 14. FIG. 14 shows a solution of a subset sum problem with Boolean-neural hybrids: two realizations of circuit dynamics with random initial states of neurons. The problem solution corresponds to the final state of single-bit flags $s_0$, $s_1$, and $s_2$ shown to the bottom. Upper curves represent the output of other neurons. The simulations were performed for $c_0=1$, $c_1=2$, $c_3=4$, and W=6.

A subset sum problem was solved in software using a Boolean-neural network. For this purpose, a circuit consisting of full adder blocks (see FIG. 3) was programmed in software for the case of three 3-bit input numbers. The neuron dynamics was simulated according to the approach described above with equal probabilities for the signal propagation in the forward and reverse directions (a=0.5). Because of the stochastic nature of approach, the number of steps is different in FIG. 14 at (a) and (b). Clearly, the obtained solution ($s_0=0$, $s_1=s_2=1$) satisfies Eq. (1).

Hardware Implementation

Boolean-neural hybrids can be implemented in hardware using emerging electronic devices (such as diffusive/volatile memristors), traditional components (e.g., CMOS), or their combination. Moreover, Boolean-neural hybrids can be implemented with field-programmable gate arrays (FPGAs) or application-specific integrated circuits (ASICs).

Figure 15:
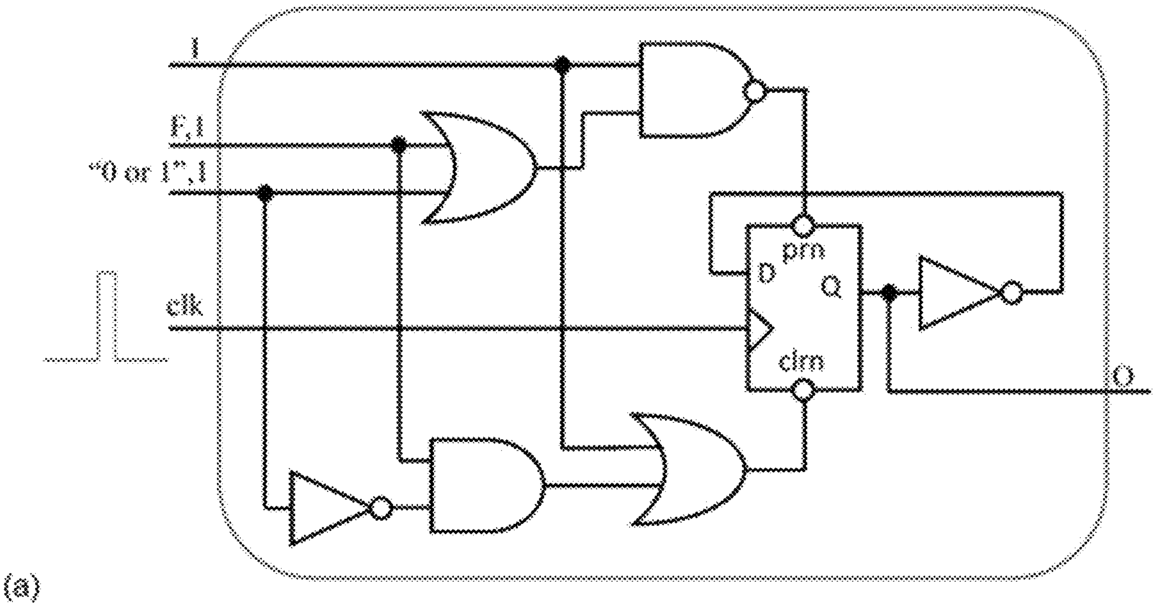
FIG. 15 shows a realization of semi-stochastic neuron using two-state logic.
Figure 15:
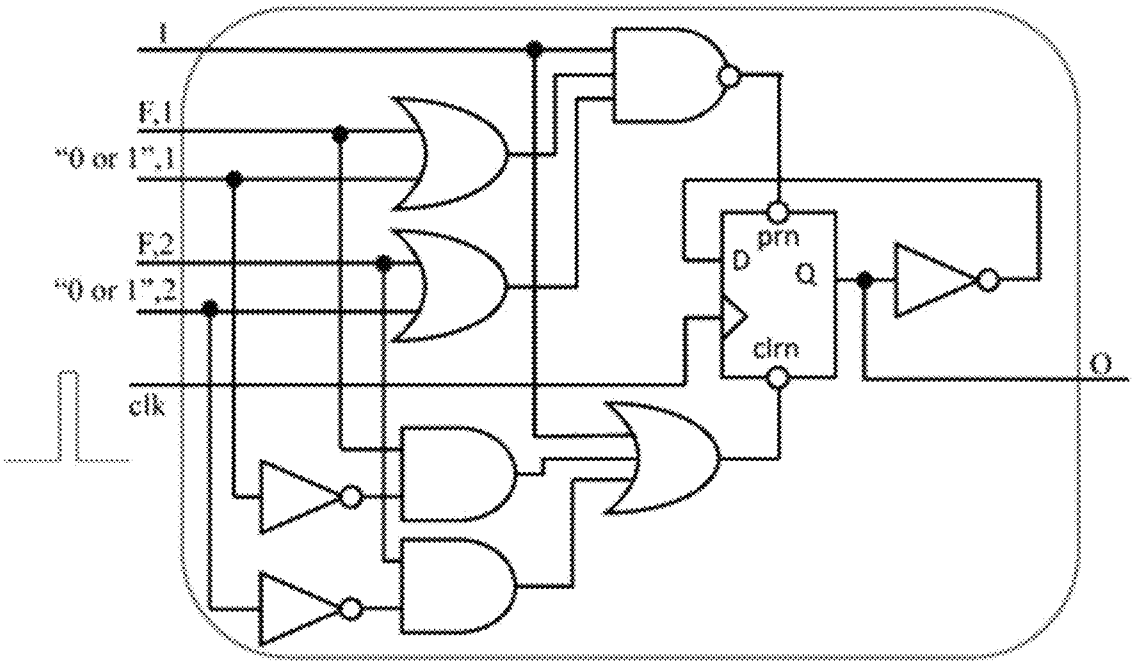

FIG. 13 shows examples of feedback circuitry (XOR and OR gates) designed based on two-level logic. FIG. 15 shows a possible realization of artificial neurons with a single (FIG. 15 at (a)) and two (FIG. 15 at (b)) feedback inputs with two-level logic. Here, the rectangular component is the edge-triggered D flip-flop (clrn and prn are asynchronous clear and preset inputs). In FIG. 15, the clear or preset input is activated when an equilibrium condition is reached. An asynchronous or synchronous clk pulse signal is applied externally to the neuron (e.g., it may be generated inside or outside of an FPGA). The clk pulse can be applied to randomly or deterministically selected neuron or group of neurons at each time step.

Neurons with a larger number of feedback inputs (than shown in FIG. 15) can be designed similarly to FIG. 15. Circuits based on the blocks similar to FIGS. 13 and 15 can be realized in hardware using traditional components (e.g., CMOS), FPGAs or ASICs. Emerging electronic components, IP core of FPGA, or external physical random number generator(s) can be used to generate the clk signal in FIG. 15.

Volatile memristors (resistors with memory) are promising components for the realization of semi-stochastic neurons. Of a particular interest are devices exhibiting two possible resistance states ($R_{ON}$ and $R_{OFF}$ states, $R_{ON}<R_{OFF}$) in a finite range of voltages and switching to the OFF state when a smaller voltage is applied. Several physical systems satisfy these requirements, including NEMS switches, Mott memristors, graphene field emitters, and diffusive memristors.

Physically, in diffusive memristors Ag atoms spread under electrical bias and regroup spontaneously under zero/small bias because of interfacial energy minimization. The effect of self-sustained oscillations in a resistor-volatile memristor circuit is promising to implement semi-stochastic neurons. Recently, the inventor has observed such oscillations in a circuit involving a relay-based volatile memristor emulator. Consider a volatile memristor switching into $R_{ON}$ at $V_M=V_{set}$ and into $R_{OFF}$ at $V_M=V_{reset}$, $V_{reset}<V_{set}$. Here, $V_M$ is the voltage across the memristor. In a resistor-volatile memristor circuit, the oscillations occur at such applied voltages, when in the $R_{OFF}$ state the voltage across the memristor $V_M>V_{set}$, and in the $R_{ON}$ state the voltage across the memristor $V_M<V_{reset}$. The current-voltage characteristics of diffusive memristors are suitable to implement self-sustained oscillations. In fact, recently an oscillatory neuron based on diffusive memristor was demonstrated.

An overall stochastic behavior can be reached through an unavoidable distribution of parameters of deterministic neurons. An intermittent (or continuous) stochastic component can be used to accelerate the convergence in circuits based on deterministic neurons. A conglomerate of semi-stochastic neurons can be used to solve the fan-in/fan-out problem in hardware realizations of Boolean-neural hybrids. Further, the current disclosure provides realizations of semi-stochastic neurons that may be used in other than Boolean-neural hybrid computing circuits as well as realizations of feedback circuitry and disclosed logic tables that may be used in other than Boolean-neural hybrid computing circuits.

Various modifications and variations of the described methods, pharmaceutical compositions, and kits of the disclosure will be apparent to those skilled in the art without departing from the scope and spirit of the disclosure. Although the disclosure has been described in connection with specific embodiments, it will be understood that it is capable of further modifications and that the disclosure as claimed should not be unduly limited to such specific embodiments. Indeed, various modifications of the described modes for carrying out the disclosure that are obvious to those skilled in the art are intended to be within the scope of the disclosure. This application is intended to cover any variations, uses, or adaptations of the disclosure following, in general, the principles of the disclosure and including such departures from the present disclosure come within known customary practice within the art to which the disclosure pertains and may be applied to the essential features herein before set forth.

What is claimed is:

1. A Boolean-neural hybrid computing circuit comprising:

at least one invertible logic gate including feedback circuitry that operates in reverse wherein the feedback circuitry provides, for each gate input, a feedback signal selected from three states "0", "1", and "0 or 1" corresponding to inverse-operation tables for the logic gate wherein input data are applied to at least one output pin and a result is read from an input;

at least one semi-stochastic neuron with an input domain divided into regions of stochastic and deterministic behavior, wherein the input domain comprises a range of a combined input V of the at least one semi-stochastic neuron as a function of a combined input V such that a neuron output is stochastic for $\delta<V<V_1-\delta$ and deterministic otherwise wherein V is a combined input;

wherein $V_1$ a voltage corresponding to a logic level one;

wherein δ is used to define at least one boundary between a stochastic and a deterministic response;

wherein the at least one semi-stochastic neuron is formed by either digital or analog electronics or a combination of digital and analog electronics and comprises at least one artificial neuron exhibiting either stochastic or deterministic behavior dependent on the input to the at least one semi-stochastic neuron;

wherein the input domain is deterministic when the at least one semi-stochastic neuron is at equilibrium and the input and an output are the same with respect to logic levels at a direct input I, feedback inputs F, and neuron output O and at least one semi-stochastic neuron output remains constant in time; and wherein the input domain is stochastic when the input and output are not the same and the at least one semi-stochastic neuron output changes stochastically until a solution corresponding to a circuit equilibrium is found, and upon reaching the circuit equilibrium the neuron output remains constant in time to store the solution deterministically.

2. The Boolean-neural hybrid computing circuit of claim 1, further comprising wherein the at least one invertible logic gate comprises:

at least one standard logic gate from a direct calculation circuit, wherein the direct calculation circuit comprises a conventional Boolean logic circuit implementing a direct calculation; and the feedback circuitry transfers information in a reverse direction.

3. The Boolean-neural hybrid computing circuit of claim 1, further comprising at least one invertible logic gate that supports both direct and inverse calculations by loading a standard direct-calculation logic gate with at least one semi-stochastic neuron and feedback circuitry that transfers reverse-direction constraint information.

4. The Boolean-neural hybrid computing circuit of claim 1, wherein at least one invertible logic gate is based on two- or three-state logic and/or emerging electronic devices.

5. The Boolean-neural hybrid computing circuit of claim 1, further comprising wherein the at least one semi-stochastic neuron searches for a problem solution stochastically and stores the problem solution deterministically when found, wherein the problem comprises a subset sum, factorization, or satisfiability problem, and wherein the problem solution is stored as a stable output state of the at least one semi-stochastic neuron at circuit equilibrium, wherein the at least one semi-stochastic neuron comprises a flip-flop-based circuit configured to latch an output state upon detecting equilibrium.

6. The Boolean-neural hybrid computing circuit of claim 1, wherein the at least one semi-stochastic neuron is described by equation:

$$BSSN(V)=H\left[\frac{V-\delta}{V_1-2\delta}-r\right].$$

7. The Boolean-neural hybrid computing circuit of claim 1, wherein the at least one semi-stochastic neuron combined input Vis calculated by equation:

$$V\begin{cases} aV_i+b\sum_j V_{F,j} & \text{(in the presence of at least one input)} \\ V_1/2 & \text{(otherwise)} \end{cases}$$

wherein $V_i$ is a direct-input voltage, V_F,j are feedback-input voltages, a and b are weights satisfying a+bN_F=1, and N_F is a number of deterministic feedback signals.

8. The Boolean-neural hybrid computing circuit of claim 1, further comprising feedback circuitry based on three-state signals "0", "1", "O or 1" and disclosed tables of inverse operations.

9. The Boolean-neural hybrid computing circuit of claim 1, further comprising a flip-flop-based design of at least one semi-stochastic neuron, wherein an edge-triggered D flip-flop includes an asynchronous clear or preset input activated when an equilibrium condition is reached.

10. A method of forming a Boolean-neural hybrid computing circuit comprising:

forming at least one invertible logic gate including feedback circuitry by configuring a logic gate and associated feedback circuitry to transfer information in a reverse direction configured to generate three-state feedback signals "0", "1", and "0 or 1" according to inverse-operation tables for the logic gate;

forming at least one semi-stochastic neuron whose input domain is divided into regions of stochastic and deterministic behavior as a function of a combined input V such that a neuron output is stochastic for $\delta<V<V_1-\delta$ and deterministic otherwise;

wherein V is a combined input;

wherein $V_1$ a voltage corresponding to a logic level one;

wherein δ is used to define at least one boundary between a stochastic and a deterministic response;

forming a Boolean-neural hybrid computing circuit that:

wherein the feedback circuitry provides three-state feedback signals "0", "1", and "0 or 1" assigned to a high-impedance state according to inverse-operation tables for the logic gate employs at least one invertible logic gate;

operates in reverse wherein input data is applied to at least one output pin and reads a result from the input data;

wherein the at least one semi-stochastic neuron is formed by either digital or analog electronics or a combination of digital and analog electronics and comprises at least one artificial neuron exhibiting either stochastic or deterministic behavior dependent on the input to the at least one semi-stochastic neuron;

wherein the input domain is deterministic when the at least one semi-stochastic neuron is at equilibrium and the input and an output are the same and at least one semi-stochastic neuron output remains constant in time; and wherein the input domain is stochastic when the input and output are not the same and the at least one semi-stochastic neuron output changes stochastically until a solution corresponding to a circuit equilibrium is found.

11. The method of claim 10, further comprising utilizing at least one invertible logic gate comprising at least one direct calculation logic gate, wherein the direct calculation logic gate comprises a standard Boolean logic gate selected from NOT, AND, NAND, OR, and XOR and feedback circuitry configured to transfer reverse-direction constraint information using three-state feedback signals "0", "1", and "0 or 1".

12. The method of claim 10, further comprising forming the Boolean-neural hybrid computing circuit to support both direct and inverse calculations by loading a standard direct-calculation logic gate with at least one semi-stochastic neuron and feedback circuitry that transfers reverse-direction constraint information.

13. The method of claim 10, further comprising the use of two- or three-state logic.

14. The method of claim 10, further comprising wherein the at least one semi-stochastic neuron searches for a problem solution stochastically and stores the problem solution deterministically when found, wherein the problem comprises a subset sum problem and the problem solution is stored as a stable neuron output at equilibrium, wherein the at least one semi-stochastic neuron comprises an edge-triggered D flip-flop configured to latch an output state upon detecting equilibrium.

15. The method of claim 10, further comprising describing the at least one semi-stochastic neuron by equation:

$$BSSN\ (V) = H\left[\frac{V-\delta}{V_1-2\delta} - r\right].$$

wherein V is a combined input, $V_1$ is a logic-one voltage, δ defines boundaries between stochastic and deterministic response, r is a random number between 0 and 1, and H is a Heaviside step function, wherein the output is stochastic for $\delta<V<V_1-\delta$ and deterministic otherwise.

16. The method of claim 10, further comprising calculating the at least one semi-stochastic neuron combined input V by equation:

$$V\begin{cases} aV_i + b\sum_j V_{F,j} & \text{(in the presence of at least one input)} \\ V_1/2 & \text{(otherwise)} \end{cases}$$

wherein $V_i$ is a direct-input voltage, V_F,j are feedback-input voltages, a and b are weights satisfying a+bN_F=1, and N_F is a number of deterministic feedback signals . . . wherein the summation is taken over deterministic feedback signals and excludes feedback signals in a "0 or 1" state: V={aV, +bΣ V F,j (in the presence of at least one input) V, /2 (otherwise).

17. The method of claim 10, further comprising a software simulation of the Boolean-neural hybrid computing circuit.

18. The method of claim 10, further comprising a hardware implementation of the Boolean-neural hybrid computing circuit.

19. The method of claim 10, further comprising a flip-flop-based design of the at least one semi-stochastic neurons, wherein an edge-triggered D flip-flop includes an asynchronous clear or preset input activated when an equilibrium condition is reached.

* * * * *